Nov. 27, 1962 W. F. GOETTER 3,066,264
POWER AMPLIFIER
Filed May 19, 1958

INVENTER:
WILLIAM F. GOETTER,
BY Joseph P. Kates
HIS ATTORNEY.

3,066,264
Patented Nov. 27, 1962

3,066,264

POWER AMPLIFIER

William F. Goetter, Baldwinsville, N.Y., assignor to General Electric Company, a corporation of New York Filed May 19, 1958, Ser. No. 736,264
6 Claims. (Cl. 330—107)

Figure 1:
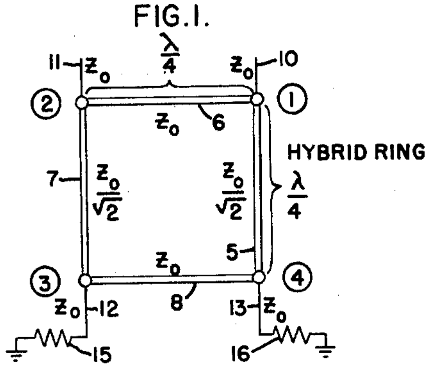

The present invention relates to a power amplifier and more particularly relates to novel method and means to provide feedback for increasing the power gain of high power radio frequency (RF) amplifiers by means of stable-controlled feedback of energy from an amplifier output to its input.

Prior art high frequency RF power amplifiers presented problems in that limitation of the power output of such amplifiers was caused by the limits of power gain of the amplifier. Solutions for providing additional driving power or increasing the power gain by means such as feedback circuits to utilize some of the output power of the amplifier to partially energize the input circuit in a regenerative feedback system have been provided. However, it proved impractical to increase driving power particularly when the amplifier was excited by equipments of limited power output. Another disadvantage of prior art power amplifiers using feedback to increase power gain was due to inherent instability upon attempting to increase the gain in this fashion. Such instability was caused by lack of isolation or by mutual coupling between the driving point of the amplifier and the feedback circuit. Because of the interdependence of tuning functions, such disadvantages were virtually impossible to eliminate by tuning adjustment and considerable back and forth manipulation of tuning adjustment with attendant use of test equipment and delay in using the equipment resulted from prior art feedback systems. Because tuning affected feedback and feedback in turn affected tuning, general instability resulted in attempts to increase the gain of power amplifiers by servo-loop or feedback systems.

The present invention overcomes these and other deficiencies of prior art high frequency RF power amplifiers and in addition provides advantages of saving driving power enabling a power amplifier to be operated without requirements for excessive driving power.

Accordingly, an object of the present invention is to provide an apparatus and method for increasing the power gain of high frequency RF power amplifiers.

Another purpose of the present invention is to provide for increasing the power gain of an RF power amplifier with a stable controlled feedback of energy from its output to its input terminals.

Another aim of the present invention is to provide a power amplifier which will have excellent isolation between its input or driving point and the feedback circuit such that variation of feedback gain has little effect on the input impedance.

Another object of the present invention is to provide a power amplifier having a feedback loop wherein variation of feedback gain will have essentially no effect on amplifier input or output circuit tuning.

Another aim of the present invention is to provide a power amplifier useful at high frequencies and wherein power output will not be limited by the maximum power gain of the power amplifier tube.

Another purpose of the present invention is to provide a power amplifier which will be operative without unduly increasing driving power, particularly useful in cases wherein exciting is caused by prior circuits having limited power output.

Another object of the present invention is to provide for a power amplifier having a feedback circuit which will have characteristics of a transmission line of a hybrid-ring or ratrace circuit, and which will provide for maximum power output, which will have excellent stability and freedom from self-sustained oscillation and in which a minimum of adjustment when the feedback is applied will be required.

Figure 2:
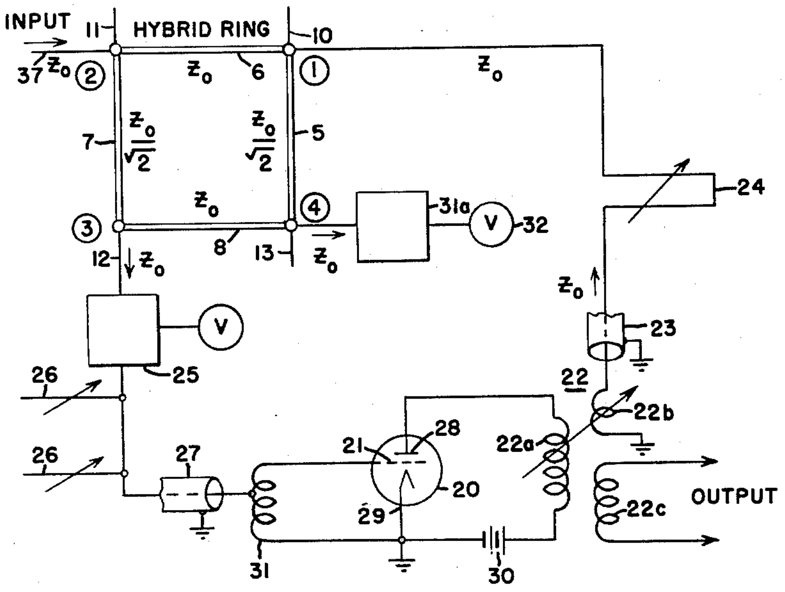

While the novel and distinctive features of the invention are particularly pointed out in the appended claims, a more expository treatment of the invention, in principle and in detail, together with additional objects and advantages thereof, is afforded by the following description and accompanying drawings in which:

FIG. 1 of the drawings is a schematic representation of an illustrative hybrid-ring circuit useful in the feedback system of the present invention; and FIG. 2 is a schematic representation of a preferred embodiment of the power amplifier of the present invention demonstrating an embodiment of the invention using the hybrid-ring or ratrace circuit of FIG. 1 in the feedback line.

Referring now to the drawings and more particularly to FIG. 1, a hybrid-ring which may be one form of the type of feedback ring used in the apparatus of the present invention is shown. This circuit may consist of four transmission line arms 5, 6, 7 and 8. Each of the transmission line arms 5, 6, 7 and 8 may be one quarter wavelength long at the frequency at which a power amplifier is to be operated. As may be seen from FIG. 1, transmission line connections 10, 11, 12 and 13 each having a surge impedance $Z_0$ may be brought out from each of the four connection points 1, 2, 3 and 4 respectively. Two of the arms 6 and 8 of the hybrid-ring may have a surge impedance $Z_0$ and the other two 5 and 7 may have a surge impedance equal to $$\frac{Z_0}{\sqrt{2}}$$

Since each of the transmission line connections have an impedance of $Z_0$, then it will not matter how long these line connections are. Within the effective frequency bandwidth of the circuit of FIG. 1, if terminating impedances 15 and 16 equal to $Z_0$ are connected from 3 and 4 and power is applied to either terminal 1 or terminal 2 alone, one half of that power will appear in each of the terminating impedances 15 and 16. However, because of the fact that in one path the power must travel a quarter of a wavelength longer than in the other path, the power in the two terminating impedances will be 90 electrical degrees different in time phase.

There is excellent isolation between terminals 1 and 2. That is, if power is applied at terminal 1, essentially no power will appear at terminal 2 and vice versa.

In addition, the impedance at terminal 1 and the power division between the terminating impedances at 3 and 4 are essentially unaffected by the terminal conditions at 2 (terminal impedance or power placed at 2) since this point is isolated from 1 and, therefore, no power appears under any terminating condition. If power is simultaneously applied to points 1 and 2 at the same frequency, the power division at points 3 and 4 will be a function of the relative amplitude and phase at 1 and 2 respectively. For example, if equal amounts of power are applied at terminal 1 and terminal 2 and if the power applied to terminal 2 is 90° in time phase behind the phase of the power at terminal 1, all of the applied power will appear in the termination at terminal 3 and the power at terminal 4 will be zero. Similarly, if the phase of the power at terminal 1 were 90° behind the phase of the power at terminal 2, all the power wouud appear at terminal 4. This is because there is a 90° delay in the power traveling from terminal 1 to terminal 4 and an additional 90° delay in traveling from terminal 4 to terminal 3. Similarly, there is a 90° delay because of the $\lambda/4$ wavelength of the impedance in traveling from terminal 2 to terminal 3 and a 90° delay due to the length of the impedance in traveling from terminal 3 to terminal 4. Therefore, the power respectively applied at terminal 1 and at terminal 2 will in one case add together to give double the power and in the second case will cancel each other since they will be 180° out of phase with respect to each other and therefore the power output will be zero at that terminal. It should be understood, of course, that these remarks are given merely by way of example and that the invention is not restricted to equal amounts of power being applied at both terminals.

For example, if the power applied to terminal 1 and to terminal 2 is 90° different in phase but of unequal amplitudes, the power division between terminal 3 and terminal 4 will be of unequal amplitude. If the power applied to terminal 1 is greater than the power applied to terminal 2 and is 90° ahead of the phase at terminal 2, the power appearing at terminal 3 will be greater than the power at terminal 4 and also more than 2 times the power applied to terminal 2. The power then appearing at terminal 4 will be less than ½ the power applied at terminal 1.

Referring now more particularly to FIG. 2, a hybrid-ring, for example, that of FIG. 1, may be applied to a preferred embodiment of the feedback system (or loop) of the present invention. A power amplifier 20, which may be a vacuum tube, semiconductor or other power amplifying device, may be provided with a control electrode 21, an anode 28 and a cathode 29. Voltage may be applied to the anode by conventional power supply means 30. Disposed between the control electrode 21 of amplifier 20 and its cathode 29 may be the input circuit of the amplifier schematically represented as tapped inductor 31. At the output of amplifier 20 for feedback purposes there may be provided output coupling such as inductive coupling comprising transformer 22 which may have a primary winding 22*a*, a secondary winding 22*c* and a tertiary winding 22*b*. The coupling between the primary 22*a* of transformer 22 and the feedback coupling loop 22*b* of transformer 22 may be made variable for a purpose to be described. The major portion of the power output may be taken across secondary 22*c* of transformer 22. A hybrid-ring identical to the hybrid-ring of FIG. 1, for example, may be inserted between the feedback variable coupling loop 22*b* and the input to amplifier 20 substantially as shown. Disposed between the feedback coupling loop 22*b* and the connection point or terminal 1 of the hybrid-ring may be a transmission line 23 having a variable length as represented by line stretcher 24 and which may have a surge impedance of $Z_0$ along its length. Connected to terminal 4 of the hybrid-ring may be a dummy load 31*a* and across the dummy load may be a test meter 32. Dummy load 31*a* should have a terminating impedance equal to $Z_0$ as represented in the arrow coming from terminal 4. Disposed between terminal 3 and input circuit 31 to power amplifier 20 may be a reflectometer 25 and a pair of matching stubs 26 which are inserted for a purpose to be hereinafter described. At the input 31 of the power (energy) amplifier or signal translating device 20 may be a coaxial line or other impedance matching device 27. The matching stubs 26 may be provided so that the impedance at the input of power amplifier 20 will match the input at the reflectometer 25 or actually at the terminating impedance of the terminal 3. That is, the matching stubs are provided so that at terminal 3 looking into the impedance at the input of the amplifier 20 the total will appear as a terminating impedance of $Z_0$. Power input to the amplifier circuit may be applied at input means at 37 and may be impressed at terminal 2.

Operation of the circuit of FIG. 2 occurs as follows: When power is coupled or tapped from the primary 22*a* of transformer 22 to the feedback coupling loop 22*b*, the power may be applied to terminal 1 through the impedance 23. Simultaneously, input power may be applied at terminal 2. Obviously, power input at terminal 37 will be required in order to provide coupling of power to the feedback loop 22*b*. In order to obtain a regenerative condition in the feedback loop, the power applied at terminal 1 should properly be substantially 90° ahead of the power input applied at terminal 2. This phase relationship is obtained by observing the meter 32 for minimum power applied to the dummy load 31*a*. The line stretcher 24 may be adjusted over its adjustable range until the minimum dip on the needle is observed at meter 32 under which condition the power applied at terminal 1 will be substantially 90° leading in phase with relation to the power input applied at terminal 2. The hybrid-ring under these conditions will behave in the manner described above for FIG. 1, that is when power is applied at terminal 1 which is equal to the power applied at the input terminal to terminal 2 and is exactly 90° leading in phase with respect to the power applied at terminal 2, then upon adjustment of the line stretcher 24 such that the reading at meter 32 is a minimum, the minimum amount of power will be dissipated in the dummy load and maximum power will be taken out of terminal 3. Under these conditions this amount of power will be approximately double the power input at terminal 2. If unequal amounts of power are applied at terminal 1 and terminal 2 and tuning for a minimum in meter 32 is effected, the maximum possible power output from terminal 3 to the amplifier 20 will result as will be apparent from previous description of the effects of applying unequal amounts of power at terminal 1 and terminal 2 in the hybrid-ring of FIG. 1.

In order to make the terminating impedance at connecting point 3 of correct amount and equal to the surge impedance $Z_0$, the reflectometer 25 is inserted in the circuit between terminal 3 and the matching stubs. The matching stubs are adjusted for minimum standing wave ratio as shown at the reflectometer. Under those conditions, proper impedance matching will result and a feedback regenerative with the input to amplifier 20 will be provided. Thus, the output at winding 22*c* of transformer 22 will be increased substantially over the amount of power input which would result from the same amount of power input at terminal 2 if the feedback loop of the present invention were not incorporated. As stated, the matching stubs 26 are provided on the amplifier input transmission line 27. This makes it possible to adjust the standing wave ratio on the transmission line from hybrid terminal 3 to essentially unity as indicated by the reflectometer and associated indicating instrument 25. In this manner both terminal 3 and terminal 4 may be terminated in impedance $Z_0$.

If the feedback variable coupling is reduced to zero and driving power is applied to terminal 2, one half of the power will reach the amplifier grid circuit at 21 and one half will be dissipated in the dummy load 31*a* connected to terminal 4. If the feedback variable coupling is increased from zero to some finite value and the length of transmission line between the variable feedback coupling loop 22*b* and hybrid terminal 1 is properly adjusted by means of the line stretcher 24, the power in the dummy load can be reduced and the power in the amplifier grid circuit increased without any change occurring at terminal 1. That is, the adjustment of the line stretcher may be effected until the meter reading of meter 32 is at zero. Thus, adjustment of this circuitry does not effect the impedance looking into the power amplifier at terminal 2. For a given value of coupling if the line stretcher 24 is adjusted for a minimum power indication at the dummy load 31a and simultaneously maximum power indication is indicated at the reflectometer 25, the phase of the feedback power at terminal 1 will be 90° ahead of the power input at terminal 2.

Under these conditions if the feedback variable coupling is varied until the feedback power applied to terminal 1 is equal to the driving power applied at terminal 2, the power dissipated in the dummy load 31a will be reduced to zero and the power applied to the amplifier grid will be 2 times the driving power at terminal 2. That is, the amplifier will be feeding back or supplying ½ of its own input driving power. A further increase in feedback variable coupling will only result in reappearance of indication of power in the dummy load and a further increase of amplifier grid circuit power without any increase of power applied to terminal 2. The grid circuit power will, however, always remain greater than the dummy load power although the ratio will be reduced with further variation in feedback coupling.

Thus, there is provided a feedback system for a power amplifier which has properties of excellent stability and which will have freedom from self-sustained oscillation. The characteristics of the hybrid-ring, when used in the above-described manner, will provide this stability. This is evident for the following reasons:

Suppose that input driving power were removed and some feedback power remained, that is that there was a tendency toward self-sustained oscillation. As soon as driving power at terminal 2 is removed, the feedback power applied at terminal 1 would divide equally between the amplifier grid circuit and the dummy load, that is between terminals 3 and 4. This would means a net reduction of the portion of feedback power reaching the amplifier grid 21 regardless of the previous ratio of feedback power to driver power at the amplifier grid. This reduction of feedback power reaching the amplifier grid provides an automatic reduction of overall feedback gain which in turn would cause an even lesser amount of power to be fed back to the amplifier grid. Thus, oscillation could not be sustained and therefore the circuit provides for excellent stability in freedom from such oscillation. It is obvious that within the normal range of operation there is little opportunity for a self-sustained oscillation to exist at a frequency removed from the driving power frequency since application of the maximum percentage of feedback power to the amplifier grid depends upon the proper phase of feedback power at terminal 1 with respect to power applied at terminal 2. That is, if a frequency such as a random noise frequency were applied at terminal 2, the phase at terminal 1 would be such that proper feedback would not take place and reinforcement of the signal would not occur.

It may be noted that preferentially the length of transmission line between the feedback variable coupling device 22b and hybrid terminal 1 should be made as short as possible in order to reduce the phase change with frequency variation to as low a value as posssible. This provides for broader bandwidth in the presence of a shorter transmission line at those points. From the design standpoint, it is advantageous in the present circuit to provide the advantage that all transmission lines in the feedback system operate with terminations equal to their surge impedance.

The present invention as exemplified by the above-described circuit therefore provides a new and improved power amplifier utilizing a feedback circuit which provides for excellent isolation between input driving point and an output feedback loop thereby insuring maximum stability of operation. In addition, a circuit is provided wherein variation of feedback gain will have substantially no effect on the amplifier input circuit tuning and essentially no effect on output circuit tuning.

Obviously, many variations of the present invention will be apparent in view of the above teachings. For example, several types of hybrid-rings or ratrace circuits may be utilized which may exhibit characteristics similar to the one herein-described and which will be of equal applicability to the feedback circuit of the present invention. Similarly, the amplifier is not restricted to a triode as shown herein, for example, it may be one of several types of circuits such as grounded-grid circuits, grounded-anode circuits, pentode tubes may be utilized, kylstron amplifiers may be utilized, and the circuit may be useful for transistor amplifier applications. Similarly, the circuit is in nowise to be construed as limited to the type of feedback coupling provided herein, for example, pickup and feedback may be introduced by capacitance, resistance, or by other coupling means know in the art. In general, it may be stated that any type of coupling which may be utilized for oscillator feedback may equally be applied to the power amplifier feedback system of the present invention.

While the principles of the invention have now been made clear, there will be immediately obvious to those skilled in the art many modifications in structure, arrangement, proportions, the elements and components used in the practice of the invention, and otherwise, which are particularly adapted for specific environments and operating requirements without departing from those principles. The appended claims are therefore intended to cover and embrace any such modifications within the limits only of the true spirit and scope of the invention.

What is claimed is:

1. Apparatus for amplifying electromagnetic wave energy comprising an amplifier device having input and output connections, a hybrid having at least three terminals including a pair of mutually isolated terminals, input terminal means for coupling electromagnetic wave energy to one of said pair of mutually isolated terminals, means for coupling the input connection of said amplifier device to a third terminal of said hybrid, means coupling said output connection to the other member of said mutually isolated terminal pair to provide an immediate feedback of energy from the output of said amplifier device to the input thereof, the phase of said feedback energy being selected to provide reenforcement with the input energy at said third terminal.

2. Apparatus as set forth in claim 1 wherein the said hybrid has at least four terminals, including two pairs of mutually isolated terminals, and having in addition thereto a dissipative load coupled to the fourth terminal, said hybrid being of the type that equally divides power applied at a member of of the one pair between the members of the other pair when properly matched.

3. Apparatus as set forth in claim 1 having in addition thereto means for varying the coupling of feedback energy from said output connection to said hybrid for adjusting the relative magnitudes of input to feedback energy.

4. Apparatus as set forth in claim 1 having in addition thereto phase adjusting means in the path coupling said amplifier to said hybrid.

5. Apparatus as set forth in claim 1 wherein said hybrid has four terminals having two pairs of mutually isolated terminals and being of the type that equally divides power applied at the member of one pair between the members of the other pair when properly matched, and having in addition thereto a dissipative load coupled to the fourth terminal thereof, means for adjusting the amount and phase of energy coupled from said output connection to said hybrid, and means coupled to said second mutually isolated pair of terminals for observing the power distribution therein.

6. Apparatus for amplifying electromagnetic wave energy comprising an amplifier device having input and output connections, a hybrid having at least four terminals including two pairs of mutually isolated terminals, input terminal means for coupling electromagnetic wave energy to one of said first pair of mutually isolated terminals, means for coupling the input connection of said amplifier device to one of said second pair of terminals of said hybrid, means coupling said output connection to the other member of said first mutually isolated terminal pair to provide an immediate feedback of energy from the output of said amplifier device to the input thereof, the phase of said feedback energy being selected to provide reenforcement with the input energy in one of said second mutually isolated pair of terminals.

References Cited in the file of this patent

UNITED STATES PATENTS

| | | |
|---|---|---|
| 2,591,637 | Tilley | Apr. 1, 1952 |
| 2,617,885 | Cutler | Nov. 11, 1952 |
| 2,725,533 | Barrow | Nov. 29, 1955 |
| 2,735,986 | Hylas et al. | Feb. 21, 1956 |
| 2,770,722 | Arams | Nov. 13, 1956 |

FOREIGN PATENTS

| | | |
|---|---|---|
| 654,906 | Great Britain | July 4, 1951 |